United States Patent
Liou et al.

(10) Patent No.: US 9,568,842 B2
(45) Date of Patent: Feb. 14, 2017

(54) OVERLAY OPERATION METHOD AND OVERLAY CONTROL METHOD

(71) Applicant: UNITED MiCROELECTRONICS CORP., Hsin-Chu (TW)

(72) Inventors: En-Chiuan Liou, Tainan (TW); Chia-Ching Lin, Kaohsiung (TW); Yi-Jing Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 144 days.

(21) Appl. No.: 14/696,488

(22) Filed: Apr. 27, 2015

(65) Prior Publication Data
US 2016/0313652 A1 Oct. 27, 2016

(51) Int. Cl.
| | | |
|---|---|---|
| *B25H 7/04* | (2006.01) | |
| *B41M 5/00* | (2006.01) | |
| *G03F 7/20* | (2006.01) | |
| *G03F 1/70* | (2012.01) | |

(52) U.S. Cl.
CPC ............. *G03F 7/70633* (2013.01); *G03F 1/70* (2013.01)

(58) Field of Classification Search
CPC ..... B41M 5/00; G03F 9/7073; G03F 7/70633; B25H 7/04
See application file for complete search history.

(56) References Cited

U.S. PATENT DOCUMENTS

| | | | |
|---|---|---|---|
| 8,571,696 B2 | 10/2013 | Blevins | |
| 2006/0020423 A1 | 1/2006 | Sharpe | |
| 2013/0208279 A1 | 8/2013 | Smith | |
| 2014/0240703 A1* | 8/2014 | Lee | G03F 7/70633 356/401 |

* cited by examiner

*Primary Examiner* — Mohammad Choudhry
(74) *Attorney, Agent, or Firm* — Winston Hsu; Scott Margo

(57) ABSTRACT

An overlay operation method and an overlay control method are disclosed. A first mark and a second mark are identified on a substrate, wherein the first mark and the second mark are formed by a process in combination with using a photomask. Next, a first measurement is performed to obtain an offset between the first mark and the second mark in a direction. Then, an operation is performed to judge whether the offset is in a range from a pre-determined offset minus a deviation to the pre-determined offset plus the deviation, wherein the pre-determined offset is determined by the photomask.

22 Claims, 8 Drawing Sheets

OVERLAY OPERATION METHOD AND OVERLAY CONTROL METHOD

BACKGROUND OF THE INVENTION

1. Field of the Invention

The present invention relates to an overlay operation method and an overlay control method, and more particularly, to an overlay operation method and an overlay control method to measure two patterns formed by a same process in combination with using a same photomask.

2. Description of the Prior Art

Semiconductor integrated circuits undergo a variety of processing steps during their manufacture, such as masking, resist coating, etching, and deposition. In many of these steps, material is overlaid or removed from the existing layer at specific locations in order to form the desired elements of the integrated circuit. Proper overlay of the various process layers is therefore critical. The shrinking dimensions of modern integrated circuits require more and more stringent overlay accuracy during the pattern transfer step. If the expected overlay tolerance is not met, the adverse result is a device that is defective or has reliability problems.

The measurement of the overlay between two or more successive layers on a wafer is one of the most critical process control techniques used in the manufacturing process of integrated circuits and devices. Overlay accuracy generally pertains to the determination of how accurately a first patterned layer aligns with respect to a second patterned layer disposed above or below it. Recently, overlay measurements are performed via test marks that are formed together with the layers of the wafer. The images of these test marks are captured via an imaging tool and an analysis algorithm is used to calculate the relative position between the marks from the captured images.

However, some issue still generated, for example, due to measurement deviation, the measured data of relative positions between the successive layers often fail to reflect their real positions. Also, since a position data of the previous marks in a previous region is used as a reference to manufacture the marks in present region, the position data of previous mark will affect the performance of presently formed mark. Thus, when the position data is deviated, the overlay accuracy between layers will decrease.

Therefore, there remains a need for controlling position data of overlay.

SUMMARY OF THE INVENTION

It is one of the objectives of the present invention to provide an overlay operation method and an overlay control method to monitor and control the overlay accuracy.

According to an embodiment of the present invention, an overlay operation method is disclosed. A first mark, a second mark and a third mark are identified on a substrate, wherein the first mark and the second mark are formed by a first process in combination with using a first photomask, and the third mark is formed by a second process in combination with using a second photomask. Next, a first measurement is performed to obtain a first offset between the first mark and the second mark in a first direction, a second offset between the first mark and the third mark in the first direction, and a third offset between the second mark and the third mark in the first direction. Then, an operation is performed to judge whether the first offset is in a first range from a first pre-determined offset minus a first deviation to the first pre-determined offset plus the first deviation, wherein the first pre-determined offset is determined by the first photomask.

According to another embodiment of the present invention, another overlay control method is disclosed. First, a substrate is provided. Then, a first layer is formed on the substrate by a first process in combination with using a first photomask, wherein the first layer comprises a first mark and a second mark. Next, a second layer is formed on the first layer by a second process different from the first process in combination with using a second photomask, wherein the second layer comprises a third mark. Subsequently, a first measurement is performed to obtain a first offset between the first mark and the second mark in a first direction, a second offset between the first mark and the third mark in the first direction, and a third offset between the second mark and the third mark in the first direction. Thereafter, an operation is performed to judge whether the first offset is in a first range from a first pre-determined offset minus a first deviation to the first pre-determined offset plus the first deviation, wherein the first pre-determined offset is determined by the first photomask.

According to another embodiment of the present invention, another overlay control method is disclosed. First, a substrate is provided. Then, a first layer is formed on the substrate by a first process in combination with using a photomask, wherein the first layer comprises a first mark and a second mark. Next, a second layer is formed on the first layer. Subsequently, a first measurement is performed to obtain a first offset between the first mark and the second mark in a first direction. Thereafter, an operation is performed to judge whether the first offset is in a first range from a first pre-determined offset minus a first deviation to the first pre-determined offset plus the first deviation, wherein the first pre-determined offset is determined by the photomask.

In the overlay operation method and the overlay control method of the present invention, the offset between two marks formed by the same process in combination with the same photomask is measured to be compared with the pre-determined offset so as to check whether the overlay alignment comply with the requirements or whether the measurement is performed regularly. Thus, when the offset is abnormal and is out of the desired range, the data of the offset can be deleted. Accordingly, the incorrect data of the overlay would not affect the overlay accuracy of the corresponding marks formed in the following processes or regions, and the overlay accuracy can be controlled and monitored well.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
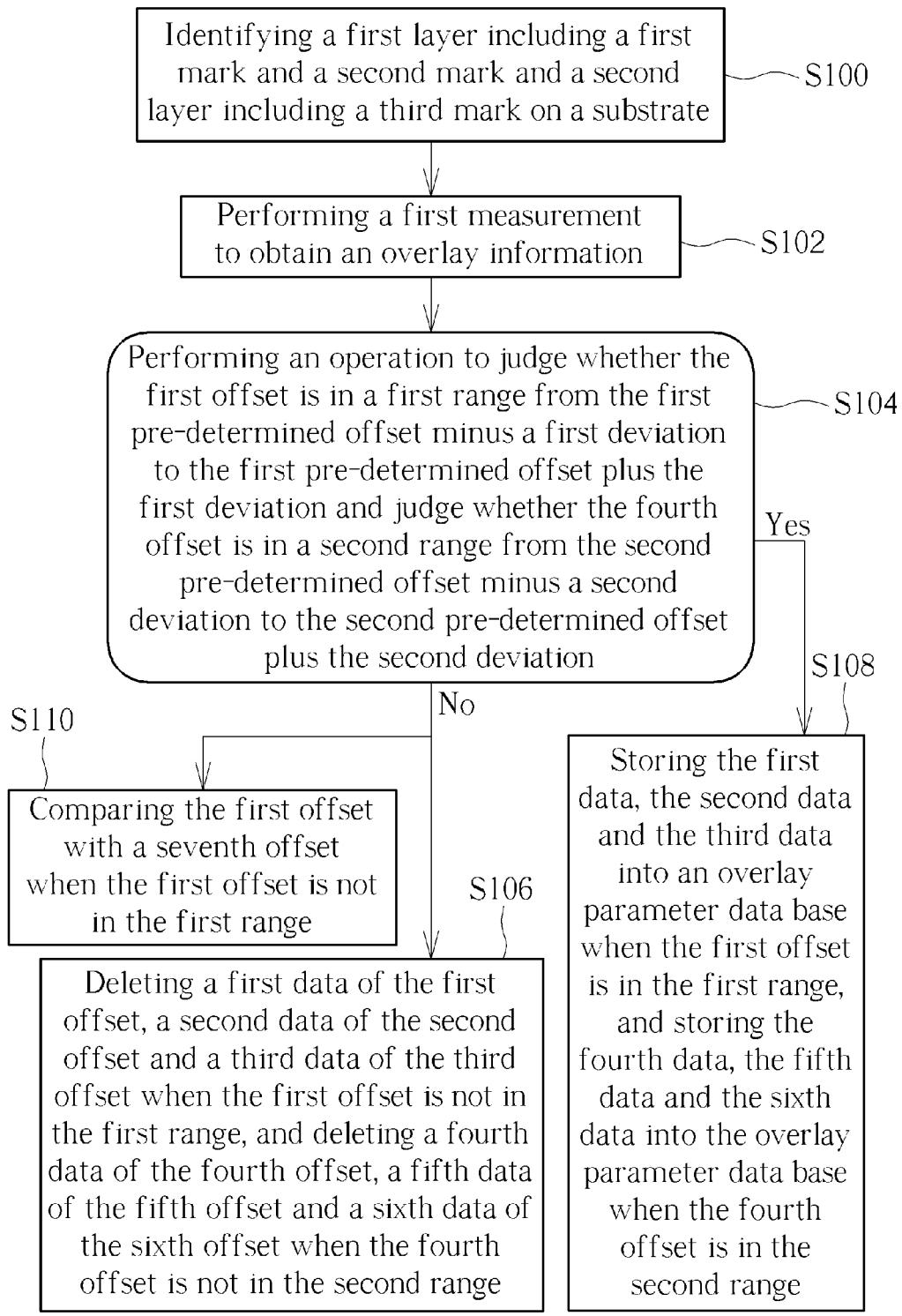
FIG. 1 is a flowchart illustrating an overlay operation method according to a first embodiment of the present invention.
Figure 2:
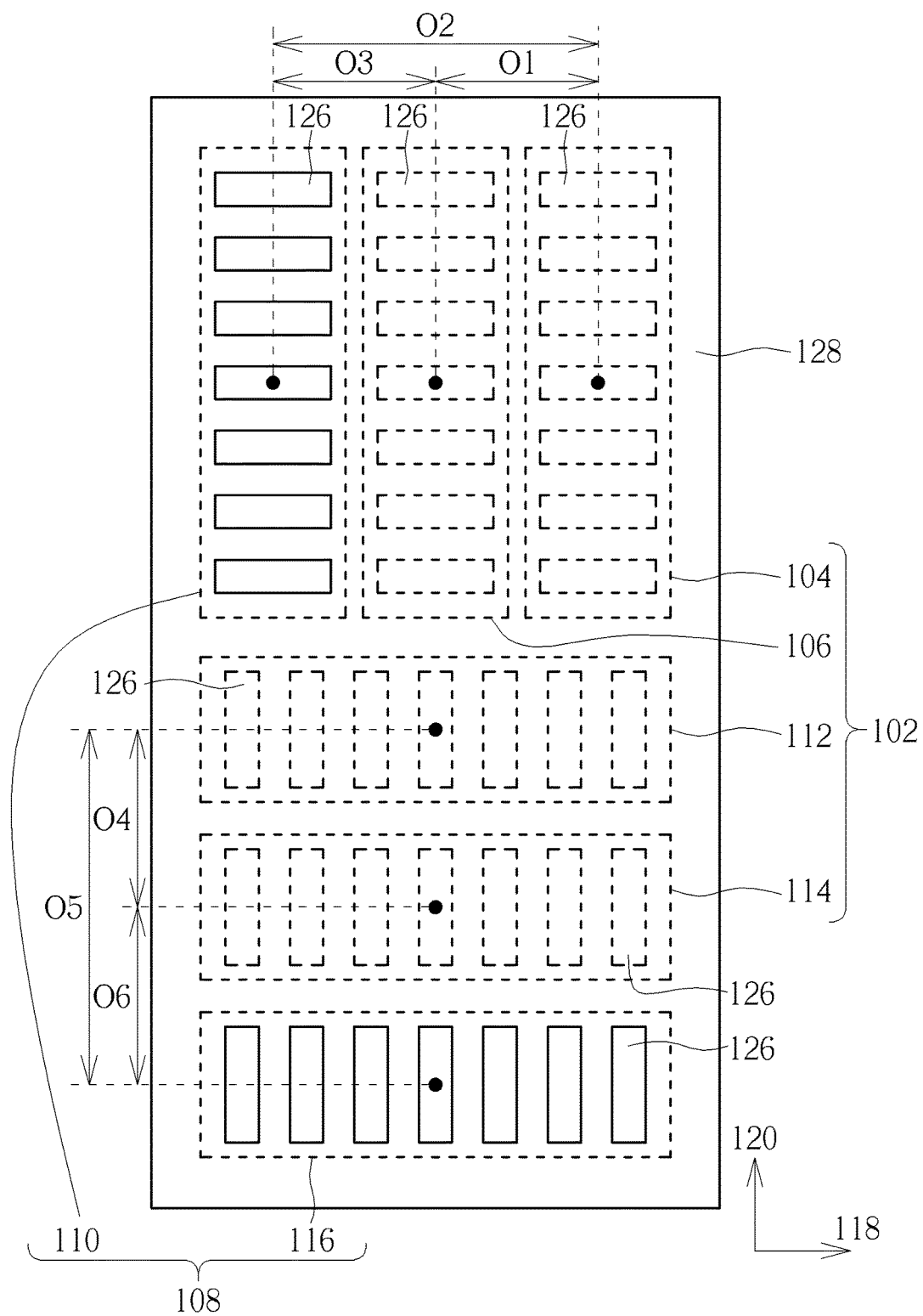
FIG. 2 is a schematic diagram illustrating a top view of the first layer and the second layer according to the first embodiment of the present invention.
Figure 3:
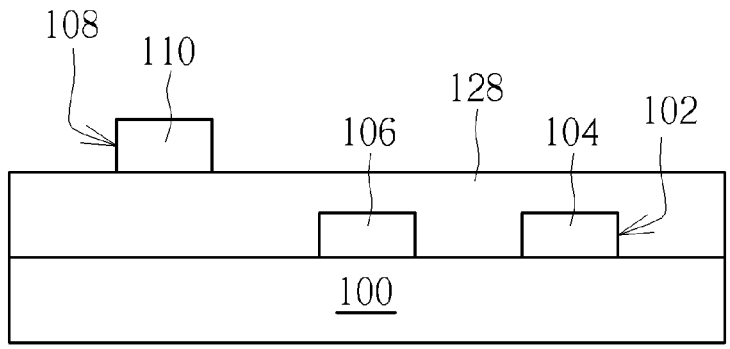
FIG. 3 is a schematic diagram illustrating a cross-sectional view of the first layer and the second layer according to the first embodiment of the present invention.

The present invention provides an overlay control method including an overlay operation method that is performed by an overlay metrology device. Refer to FIGS. 1-3. FIG. 1 is a flow chart illustrating an overlay operation method according to a first embodiment of the present invention; FIG. 2 is a schematic diagram illustrating a top view of the first layer and the second layer according to the first embodiment of the present invention; and FIG. 3 is a schematic diagram illustrating a cross-sectional view of the first layer and the second layer according to the first embodiment of the present invention. As shown in FIGS. 1-3, the overlay operation method includes the following steps. First, in step S100, a first layer 102 including a first mark 104 and a second mark 106 and a second layer 108 including a third mark 110 are identified on a substrate 100 by the overlay metrology device. Specifically, the overlay metrology device may capture a top view of the first mark 104, the second mark 106 and the third mark 110 and then recognize the first mark 104, the second mark 106 and the third mark 110 through a program therein.

In this embodiment, the first layer 102 may optionally further include a fourth mark 112 and a fifth mark 114, and the second layer 108 may optionally further include a sixth mark 116. For example, the first mark 104, the second mark 106 and the third mark 110 are sequentially arranged along a first direction 118, and the fourth mark 112, the fifth mark 114 and the sixth mark 116 are sequentially arranged along a second direction 120 perpendicular to the first direction 118.

For example, the first mark 104, the second mark 106, the third mark 110, the fourth mark 112, the fifth mark 114 and the sixth mark 116 may have a same bar-shaped pattern and may be a periodic structure including a plurality of repeated patterns 126. In the first mark 104, the second mark 106 and the third mark 110, the repeated patterns 126 are arranged along the second direction 120. In the fourth mark 112, the fifth mark 114 and the sixth mark 116 are arranged along the first direction 118. In another variant, at least two of the patterns of the first mark 104, the second mark 106, the third mark 110, the fourth mark 112, the fifth mark 114 and the sixth mark 116 may be different. Also, the arrangement of the first mark 104, the second mark 106, the third mark 110, the fourth mark 112, the fifth mark 114 and the sixth mark 116 may be adjusted according to the requirements.

Figure 4:
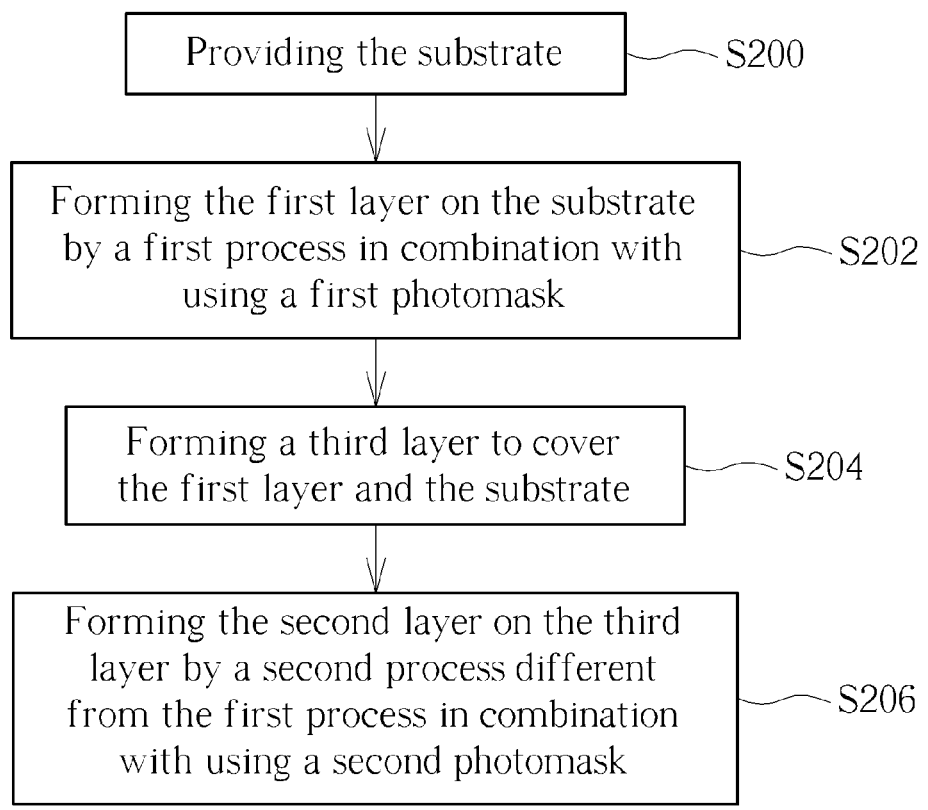
FIG. 4 is a flow chart illustrating steps for forming the first layer and the second layer according to the first embodiment of the present invention.
Figure 5:
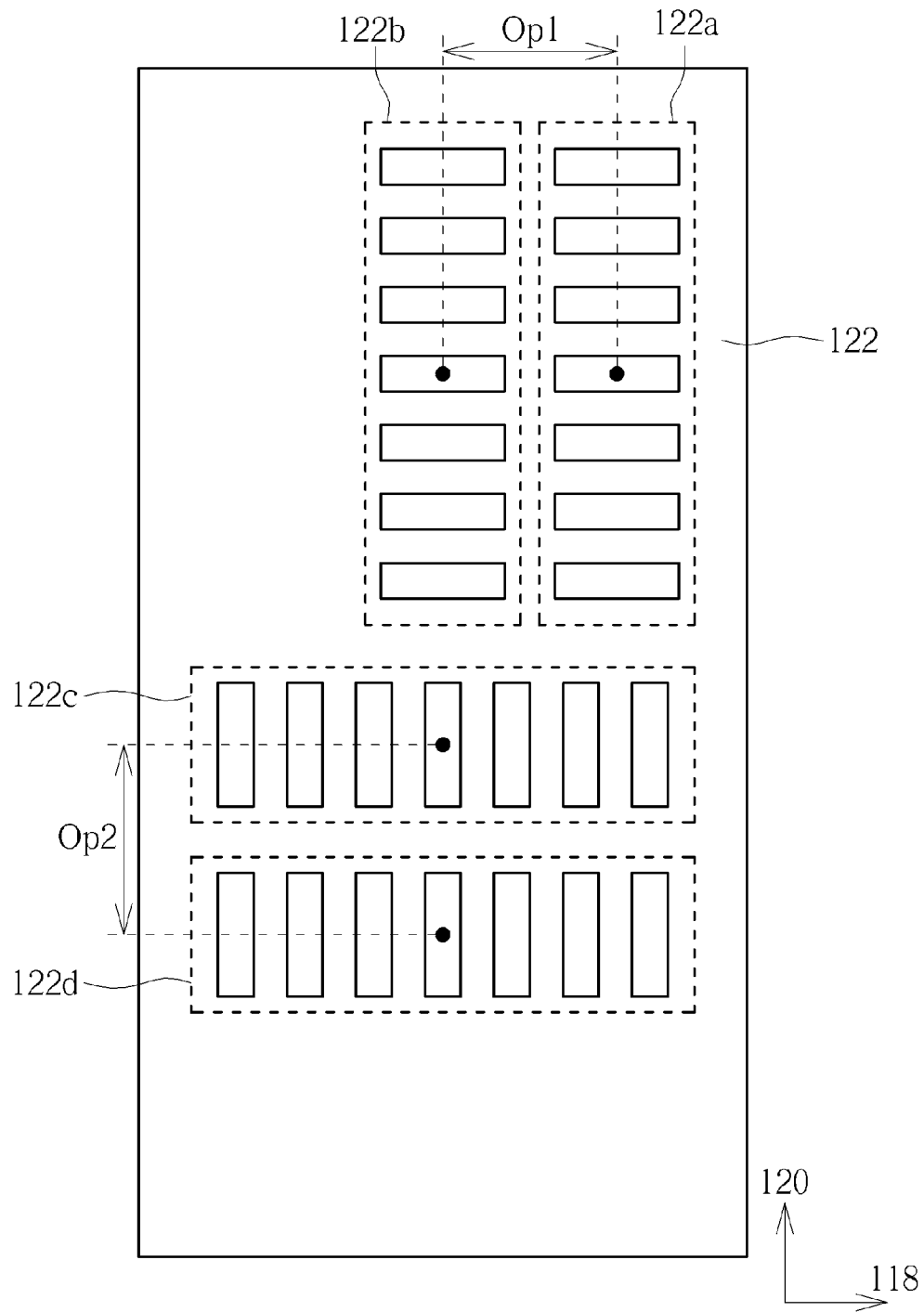
FIG. 5 is a schematic diagram illustrating a first photomask for forming the first layer.
Figure 6:
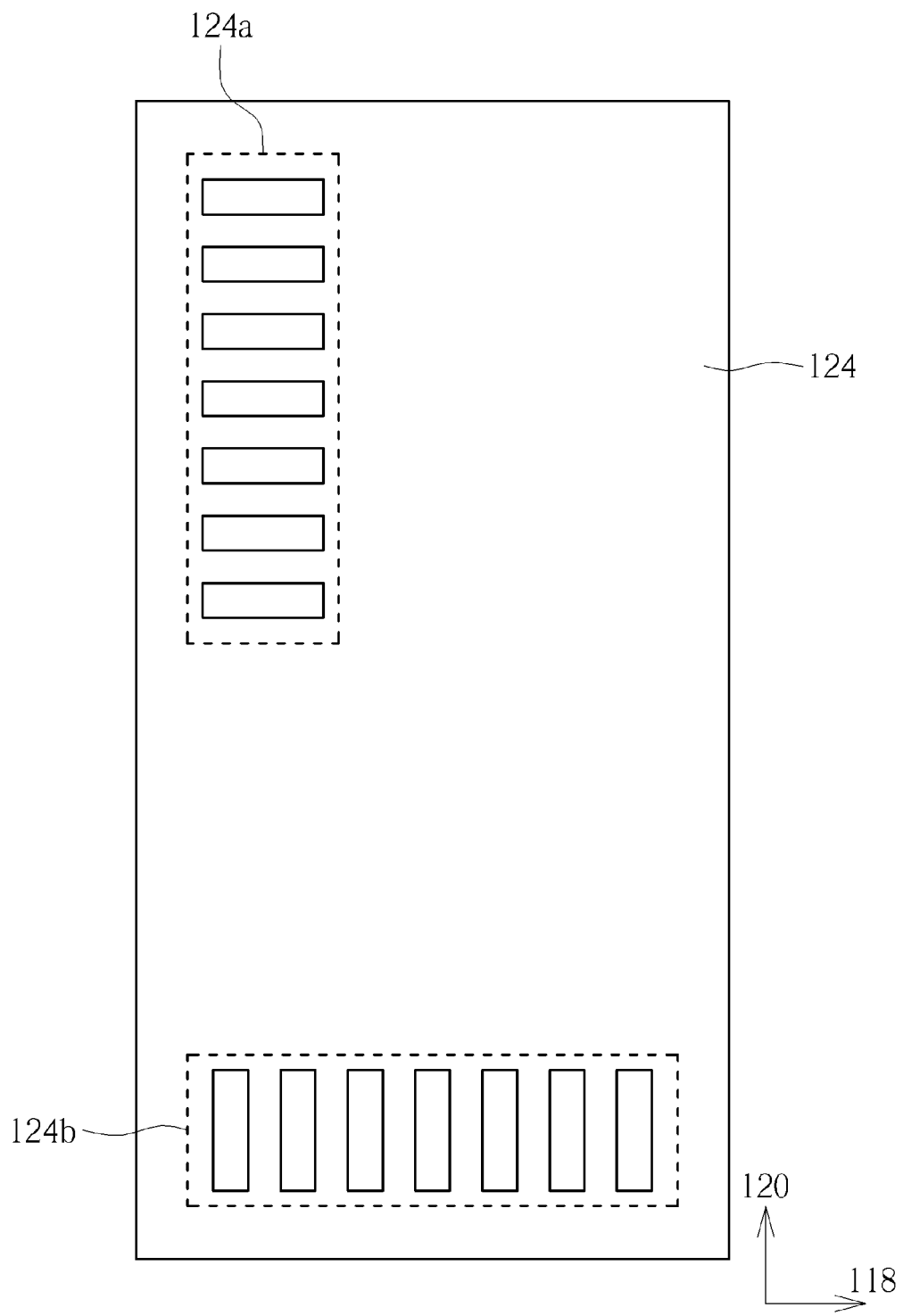
FIG. 6 is a schematic diagram illustrating a second photomask for forming the second layer.

Besides including the overlay operation method, the overlay control method may include the steps for forming the first layer 102 and the second layer 108, and the structure of the first layer 102 and the second layer 108 and the method for forming them will be detailed in the following description. Refer to FIGS. 4-6 together with FIGS. 2-3. FIG. 4 is a flow chart illustrating steps for forming the first layer 102 and the second layer 108 according to the first embodiment of the present invention; FIG. 5 is a schematic diagram illustrating a first photomask for forming the first layer 102; and FIG. 6 is a schematic diagram illustrating a second photomask for forming the second layer 108. In this embodiment, the overlay control method further includes the following steps S200, S202, S204 and S206 for forming the first layer 102 and the second layer 108 and the steps S200, S202, S204 and S206 are performed before step S100.

In step S200, the substrate 100 is provided. The substrate 100 may be for example a wafer or other semiconductor substrate. Thereafter, in step S202, the first layer 102 is formed on the substrate 100 by a first process in combination with using a first photomask 122 shown in FIG. 5. Thus, the first mark 104, the second mark 106, the fourth mark 112 and fifth mark 114 are formed together. For example, the first process may be used to form poly gates, so the first layer 102 is formed of poly silicon. Preferably, the first mark 104, the second mark 106, the fourth mark 112 and fifth mark 114 may be disposed under a scribe line, but the present invention is not limited thereto. The first layer 102 may be any patterned layer of a semiconductor device. The first layer 102 may further include other devices. In another variant, the first layer may only include the first mark and the second mark, and the second layer may only include the third mark.

In this embodiment, the first photomask 122 may include a first mark pattern 122a, a second mark pattern 122b, a third mark pattern 122c and a fourth mark pattern 122d used to form the first mark 104, the second mark 106, the fourth mark 112 and the fifth mark 114 on the substrate 100 respectively. Also, a center of the first mark pattern 122a and a center of the second mark pattern 122b have a first pre-determined offset Op1 between them in the first direction 118. For example, the first pre-determined offset Op1 may be 8 nm, but is not limited thereto. A center of the third mark pattern 122c and a center of the fourth mark pattern 122d have a second pre-determined offset Op2 between them in the second direction 120. For example, the second pre-determined offset Op2 may be 8 nm, but is not limited thereto. The first pre-determined offset Op1 and the second pre-determined offset Op2 are larger than zero in this embodiment. In another variant, the first pre-determined offset or the second pre-determined offset may be zero. When the first pre-determined offset, the first mark pattern and the second mark pattern have the same center but have different sizes; that is, the first mark pattern and the second mark pattern may form a shape of "回". Similarly, when the second pre-determined offset are zero, the third mark pattern and the fourth mark pattern may be square-shaped and have the same center but different sizes.

It should be noted that the accuracy of transferring the first mark pattern 122a, the second mark pattern 122b, the third mark pattern 122c and the fourth mark pattern 122d to the first mark 104, the second mark 106, the fourth mark 112 and the fifth mark 114 is determined based on the stability and preciseness of the first process, so that the overlay operation method of this embodiment can be used to judge whether the accuracy is in a desired range.

In step S204, after forming the first layer 102, a third layer 128 may be selectively formed to cover the first layer 102 and the substrate 100. The third layer 128 may be an insulating layer for electrically insulating the first layer 102 from layers formed on the first layer 102 or other device layers.

In step S206, subsequently, the second layer 108 is formed on the third layer 128 by a second process different from the first process in combination with using a second photomask 124 shown in FIG. 6. The second photomask 124 includes a fifth mark pattern 124a and a sixth mark pattern 124b used to form the third mark 110 and sixth mark 116 on the substrate 100 respectively. It should be noted that the second photomask 124 is aligned according to positions of the first mark 104 and the second mark 106 on the substrate 100, so that the alignment accuracy of the second layer 108 is based on the position data of the first layer 102. Also, since the second layer 108 is formed at least after the third layer 128 covers the first layer 102, the position of the first layer 102 is not easily to be measured. Accordingly, there exists an overlay information between the first layer 102 and the second layer 108 needed to be monitored in the overlay operation method.

In another variant, no third layer may be formed. In this situation, the first layer and the second layer may be formed in a same level, and the first layer and the second layer may be formed by a double patterning process.

Refer to FIG. 1 again and also refer to FIGS. 2 and 3. In step S102, a first measurement is performed to obtain the overlay information. The overlay information may include a first offset O1 between the first mark 104 and the second mark 106 in the first direction 118, a second offset O2 between the first mark 104 and the third mark 110 in the first direction 118 and a third offset O3 between the second mark 106 and the third mark 110 in the first direction 118. Through the first offset O1, the second offset O2 and the third offset O3, the overlay between the first layer 102 and the second layer 108 in the first direction 118 can be known. In this embodiment, the first measurement may directly measure the image of the first mark 104, the second mark 106 and the third mark 110 or further comprise calculating the data of the first mark 104, the second mark 106 and the third mark 110 to obtain the overlay information through the overlay metrology device.

In this embodiment, the overlay information may optionally further include a fourth offset O4 between the fourth mark 112 and the fifth mark 114 in the second direction 120, a fifth offset O5 between the fourth mark 112 and the sixth mark 116 in the second direction 120 and a sixth offset O6 between the fifth mark 114 and the sixth mark 116 in the second direction 120. Through them, the overlay between the first layer 102 and the second layer 108 in the second direction 120 can be known.

In another variant, the first measurement may be performed before the second layer 108 is formed, so that the overlay information may only include the data of the first layer that is the first offset and the fourth offset.

In step S104, after obtaining the first offset O1, the second offset O2 and the third offset O3, an operation is performed to judge whether the first offset O1 is in a first range from the first pre-determined offset Op1 minus a first deviation to the first pre-determined offset Op1 plus the first deviation through the overlay metrology device, where the first deviation is determined based on the overlay tolerance in the first direction 118 or the requirements. Thus, the first deviation can be preset in the overlay metrology device. For example, the first deviation may be 1 nm, but is not limited thereto.

In this embodiment, the step S104 may optionally further include judging whether the fourth offset O4 is in a second range from the second pre-determined offset Op2 minus a second deviation to the second pre-determined offset Op2 plus the second deviation through the overlay metrology device, where the second deviation is determined based on the overlay tolerance in the second direction 120 or the requirements. Thus, the second deviation can also be preset in the overlay metrology device. For example, the second deviation may be 1 nm, but is not limited thereto. It should be noted that the first pre-determined offset Op1 and the second pre-determined offset Op2 are determined by the first photomask, so that the first pre-determined offset Op1 and the second pre-determined offset Op2 can be used as references to compare with the measured overlay information for recognizing whether the overlay information is in the desired range.

In step S106, when the first offset O1 is not in the first range from the first pre-determined offset Op1 minus the first deviation to the first pre-determined offset Op1 plus the first deviation, a first data of the first offset O1, a second data of the second offset O2 and a third data of the third offset O3 are deleted from the overlay metrology device. Specifically, since the first pre-determined offset Op1 that is determined by the first photomask 122 represents the relative position between the first mark pattern 122a and the second mark pattern 122b in the first direction 118, the step S106 can be used to check whether the overlay alignment in the first direction 118 comply with the requirements or whether the first measurement is performed regularly. Since the first offset O1 is not in the first range, which means the misalignment of the first mark 104 and the second mark 106 in the first direction 118 captured by the overlay metrology device is generated or the measure of the first mark 104 and the second mark 106 is incorrect, the second data of the second offset O2 and the third data of the third offset O3 should not comply with the requirements, and would not be stored into an overlay parameter data base that is used to manufacture corresponding marks in next processes or in next regions. Accordingly, the incorrect data of the overlay in the first direction 118 would not affect the overlay accuracy in the first direction 118 of the corresponding marks formed in the following processes or regions, and the overlay accuracy in the first direction 118 can be controlled and monitored well.

In this embodiment, the step S106 may optionally further include when the fourth offset O4 is not in the second range from the second pre-determined offset Op2 minus the second deviation to the second pre-determined offset Op2 plus the second deviation, a fourth data of the fourth offset O4, a fifth data of the fifth offset O5 and a sixth data of the sixth offset O6 are deleted from the overlay metrology device. The second pre-determined offset Op2 that is also determined by the first photomask 122 represents the relative position between the third mark pattern 122c and the fourth mark pattern 122d in the second direction 120. Hence, the data representing misalignment of the fourth mark 112 and the fifth mark 114 in the second direction 120 or incorrect measure of the fourth mark 112 and the fifth mark 114 would not be stored into the overlay parameter data base. Accordingly, the incorrect data of the overlay in second direction 120 would not affect the overlay accuracy in the second direction 120 of the corresponding marks formed in the following processes or regions, and the overlay accuracy in the second direction 120 can be controlled and monitored well. In another variant, the step S106 may delete the first data, second data and the third data and/or the fourth data, the fifth data and the sixth data when at least one of events that are the first offset being not in the first range and the fourth offset being not in the second range is generated.

In step S108, when the first offset O1 is in the first range from the first pre-determined offset Op1 minus the first deviation to the first pre-determined offset Op1 plus the first deviation, the first data of the first offset O1, the second data of the second offset O2 and the third data of the second offset O3 are stored into the overlay parameter data base. Since the first data, the second data and the third data are in the desired range, next processes using the first data, the second data and the third data as references would not result in misalignment. Similarly, when the fourth offset O4 is in the second range from the second pre-determined offset Op2 minus the second deviation to the second pre-determined offset Op2 plus the second deviation, the fourth data of the fourth offset O4, the fifth data of the fifth offset O5 and the sixth data of the sixth offset O6 are also stored into the overlay parameter data base.

In this embodiment, the overlay operation method may optionally include step S110 when the first offset O1 is not in the first range from the first pre-determined offset Op1 minus the first deviation to the first pre-determined offset Op1 plus the first deviation and/or when the fourth offset O4 is not in the second range from the second pre-determined offset Op2 minus the second deviation to the second pre-determined offset Op2 plus the second deviation. In step S110, when the first offset O1 is not in the range from the first pre-determined offset Op1 minus the first deviation to the first pre-determined offset Op1 plus the first deviation, the first offset O1 is compared with a seventh offset O7 corresponding to the first offset O1 and being measured in a last region by the overlay metrology device or other control device.

Figure 7:
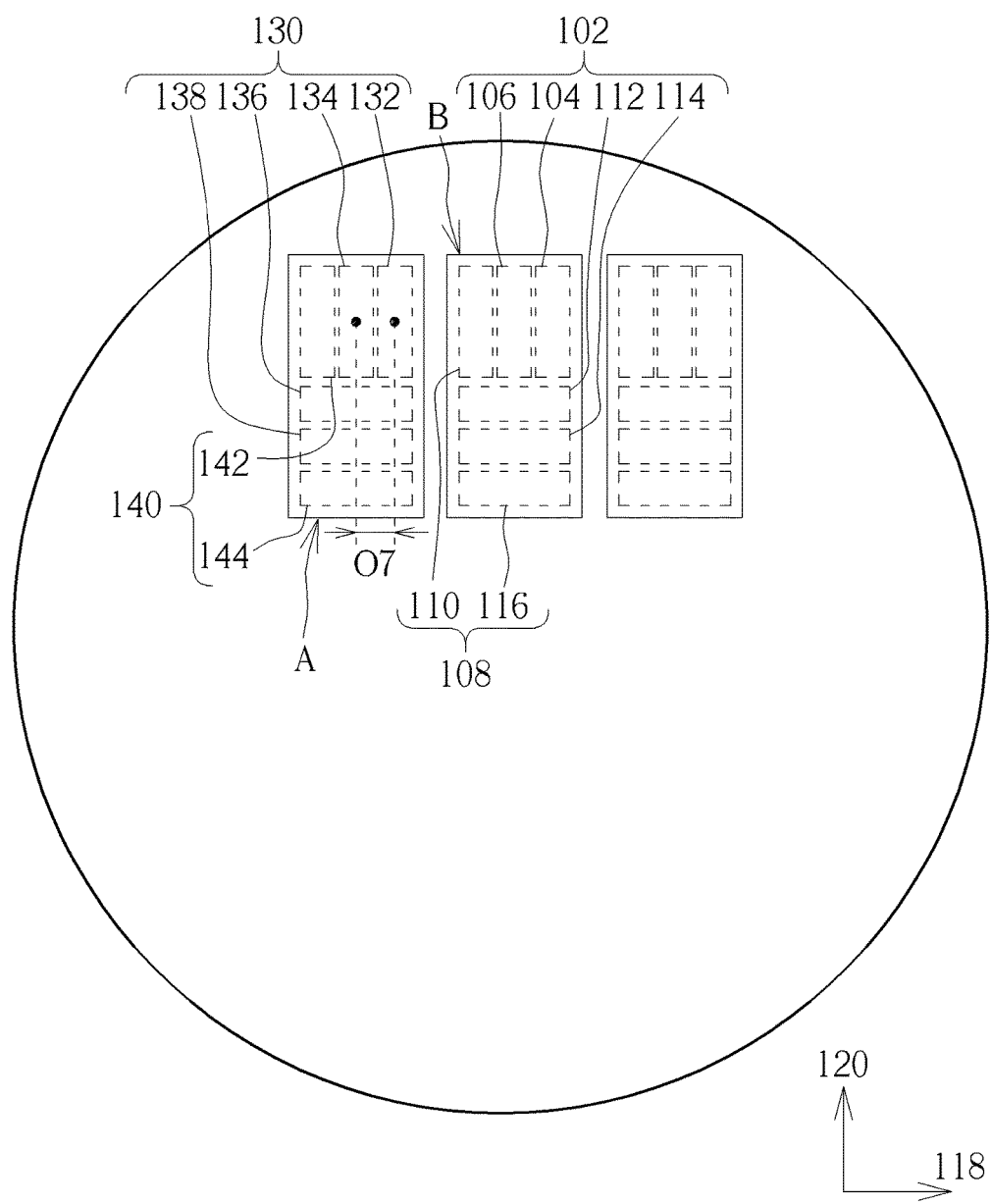
FIG. 7 is a schematic diagram illustrating different regions formed by using the same first photomask and the same second photomask.
Figure 8:
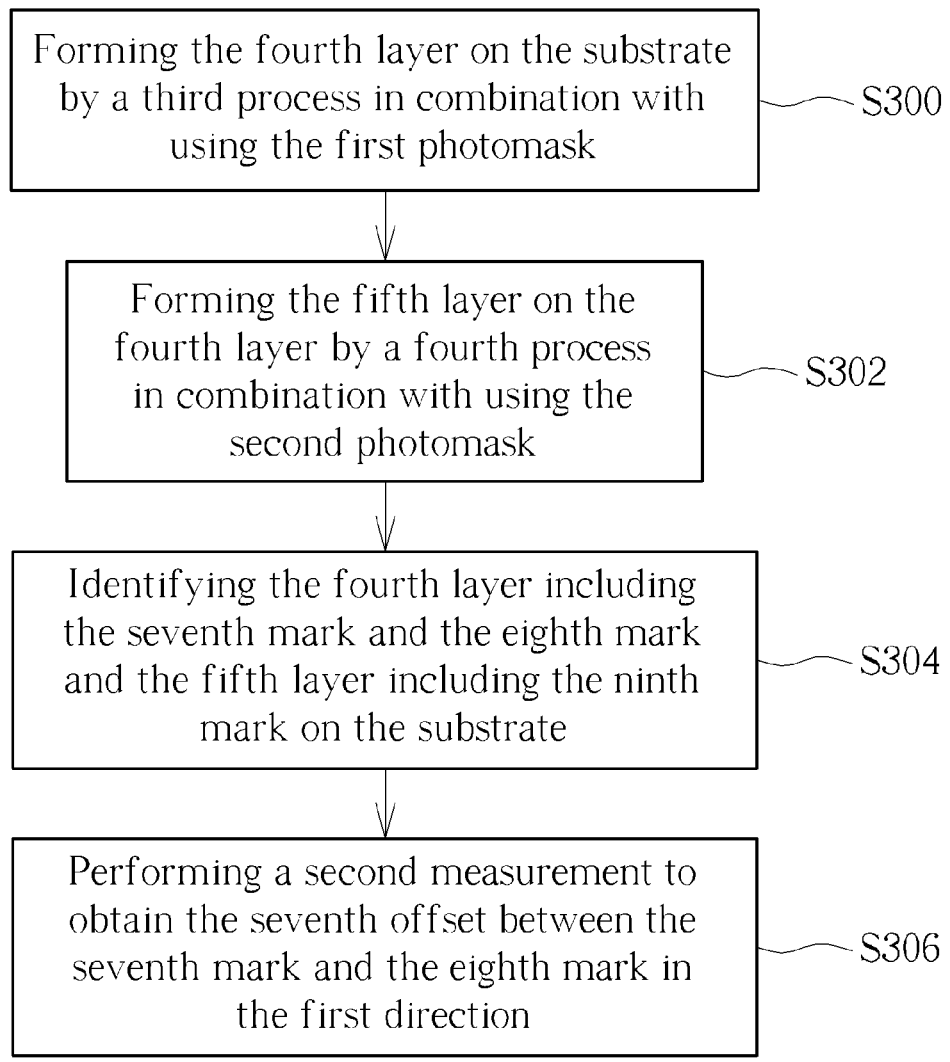
FIG. 8 is a flow chart illustrating steps for obtaining the seventh offset according to the first embodiment of the present invention.

The seventh offset O7 will be detailed in the following description. Refer to FIG. 7 and FIG. 8 with FIG. 1. FIG. 7 is a schematic diagram illustrating different regions formed by using the same first photomask 122 and the same second photomask 124. FIG. 8 is a flow chart illustrating steps for obtaining the seventh offset according to the first embodiment of the present invention. Specifically, the overlay control method further includes step S300 and step S302, and the overlay operation method further includes step S304 and step S306 performed after step S302. Steps S300, S302, S304 and S306 are performed before performing step S100. In this embodiment, steps S300, S302, S304 and S306 are performed in a region A, and steps S100, S102, S104, S202, S204 and S206 are performed in a region B. The region A may be near the region B, but the present invention is not limited thereto. In another variant, the region A and the region B may be disposed in different substrates, which means the layers formed by step S300 and step S302 are formed in different substrates or lots from the first layer and the second layer.

In step S300, a fourth layer 130 corresponding to the first layer 102 is formed on the substrate 100 by a third process in combination with using the first photomask 122 before forming the first layer 102, wherein the fourth layer 130 includes a seventh mark 132 and an eighth mark 134. In this embodiment, the third process is the same as the first process, and the fourth layer 130 is formed by using the same first photomask 122 as the first layer 102. Thus, the pattern of the fourth layer 130 can be the same as the pattern of the first layer 102, and will not be detailed redundantly. That is to say, the seventh mark 132 and the eighth mark 134 can be the same as the first mark 104 and the second mark 106 respectively. Also, the fourth layer 130 may optionally further include a tenth mark 136 corresponding to the fourth mark 112 and an eleventh mark 138 corresponding to the fifth mark 114.

In step S302, a fifth layer 140 corresponding to the second layer 108 is formed on the fourth layer 130 by a fourth process different from the third process in combination with using the second photomask 124 before forming the second layer 108, wherein the fifth layer 140 includes a ninth mark 142. In this embodiment, the fourth process is the same as the second process, and the fifth layer 140 is formed by using the same second photomask 124 as the second layer 108, so that the pattern of the fifth layer 140 can be the same as the pattern of the second layer 108, and the ninth mark 142 can be the same as the third mark 110. Also, the fifth layer 140 may optionally further include a twelfth mark 144 corresponding to the sixth mark 116. In this embodiment, a sixth layer may be formed between the fourth layer 130 and the fifth layer 140.

In step S304, the fourth layer 130 including the seventh mark 132 and the eighth mark 134 and the fifth layer 140 including the ninth mark 142 are identified on the substrate 100 by the overlay metrology device.

In step S306, a second measurement is performed to obtain the seventh offset O7 between the seventh mark 132 and the eighth mark 134 in the first direction 118. Also, after step S306, an operation may be performed to judge whether the seventh offset O7 is in the first range.

Since step S110 compares the first offset O1 with the seventh offset O7 when the first offset O1 is not in the first range, the step S110 can be used to check that the region B is formed regularly or not. Accordingly, the first data of the first offset O1 can be used to find which region is formed firstly with bad overlay accuracy, and the overlay metrology device or other control device can filter out the first data of the first offset O1 and find the reason why the overlay accuracy is reduced. Thus, the overlay accuracy in the first direction 118 can be controlled and monitored well.

In this embodiment, the second measurement may further include obtain an eighth offset between the seventh mark 132 and the ninth mark 142, a ninth offset between the eighth mark 134 and the ninth mark 142, a tenth offset between the tenth mark 136 and the eleventh mark 138, an eleventh offset between the tenth mark 136 and the twelfth mark 144 and a twelfth offset between the eleventh mark 138 and the twelfth mark 144. Similar to the step S110, the fourth offset O4 may be compared with the tenth offset, so the overlay accuracy in the second direction 120 also may be controlled and monitored well. Furthermore, the operation after step S306 may also include judging whether the tenth offset is in the second range.

The patterns of the first layer and the second layer of the present invention are not limited to the above-mentioned embodiment. The following description continues to detail the other embodiments or variants, and in order to simplify and show the difference between the other embodiments or variants and the above-mentioned embodiment, the same numerals denote the same components in the following description, and the same parts are not detailed redundantly.

Figure 9:
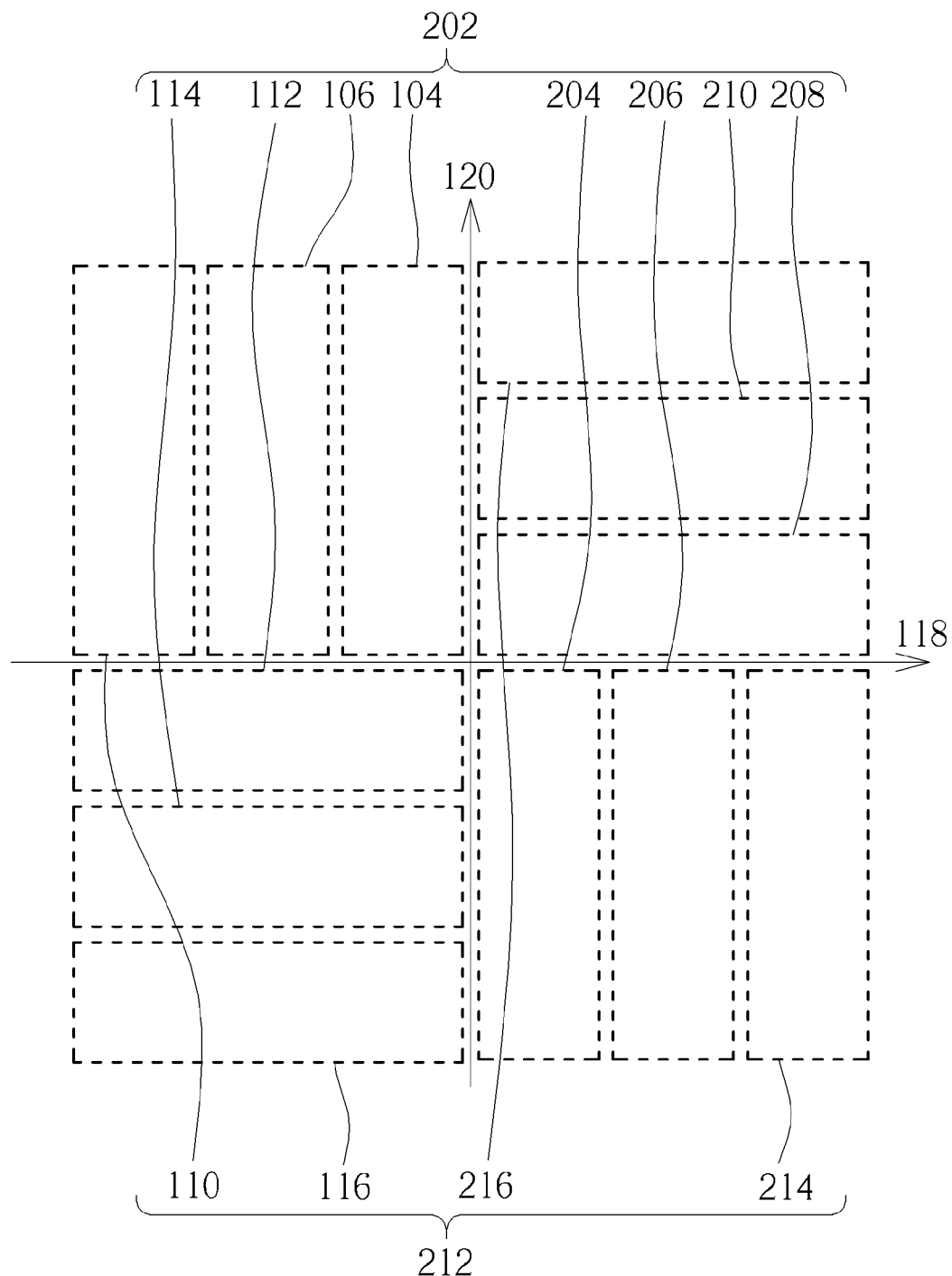
FIG. 9 is a schematic diagram illustrating a top view of a first layer and a second layer according to a second embodiment of the present invention.

Refer to FIG. 9, which is a schematic diagram illustrating a top view of a first layer and a second layer according to a second embodiment of the present invention. As shown in FIG. 9, the first layer 202 further includes a thirteenth mark 204, a fourteenth mark 206, a fifteenth mark 208 and a sixteenth mark 210. The second layer 212 further includes a seventeenth mark 214 and an eighteen mark 216. In this embodiment, the first mark 104, the second mark 106 and the third mark 110 are disposed in a second quadrant of a Cartesian coordinate system formed by the first direction 118 and the second direction 120; the fourth mark 112, the fifth mark 114 and the sixth mark 116 are disposed in a third quadrant of the Cartesian coordinate system; the thirteenth mark 204, the fourteenth mark 206 and the seventeenth mark 214 are disposed in a fourth quadrant of the Cartesian coordinate system; and the fifteenth mark 208, the sixteenth mark 210 and the eighteen mark 216 are disposed in a first quadrant of the Cartesian coordinate system. The first offset may be measured between a center between the first mark 104 and the thirteenth mark 204 and a center between the second mark 106 and the fourteenth mark 206. Similarly, the second offset to the sixth offset can be measured in the same way.

As the above-mentioned description, in the overlay operation method and the overlay control method of the present invention, the offset between two marks formed by the same process in combination with the same photomask is measured to be compared with the pre-determined offset so as to check whether the overlay alignment comply with the requirements or whether the measurement is performed regularly. Thus, when the offset is abnormal and is out of the desired range, the data of the offset can be deleted. Accordingly, the incorrect data of the overlay would not affect the overlay accuracy of the corresponding marks formed in the following processes or regions, and the overlay accuracy can be controlled and monitored well.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An overlay operation method, comprising:
   identifying a first mark, a second mark and a third mark on a substrate, wherein the first mark and the second mark are formed by a first process in combination with using a first photomask, and the third mark is formed by a second process in combination with using a second photomask;
   performing a first measurement to obtain a first offset between the first mark and the second mark in a first direction, a second offset between the first mark and the third mark in the first direction, and a third offset between the second mark and the third mark in the first direction; and
   performing an operation to judge whether the first offset is in a first range from a first pre-determined offset minus a first deviation to the first pre-determined offset plus the first deviation, wherein the first pre-determined offset is determined by the first photomask.

2. The overlay operation method according to claim 1, further comprising deleting a first data of the second offset and a second data of the third offset when the first offset is not in the first range from the first pre-determined offset minus the first deviation to the first pre-determined offset plus the first deviation.

3. The overlay operation method according to claim 1, further comprising storing a first data of the second offset and a second data of the third offset into an overlay parameter data base when the first offset is in the first range from the first pre-determined offset minus the first deviation to the first pre-determined offset plus the first deviation.

4. The overlay operation method according to claim 1, further comprising identifying a fourth mark, a fifth mark and a sixth mark, wherein the fourth mark and the fifth mark are formed together with the first mark and the second mark, the sixth mark is formed together with the third mark, and the fourth mark, the fifth mark and the sixth mark are arranged along a second direction perpendicular to the first direction.

5. The overlay operation method according to claim 4, wherein performing the first measurement further comprises obtaining a fourth offset between the fourth mark and the fifth mark in the second direction, a fifth offset between the fourth mark and the sixth mark in the second direction, and a sixth offset between the fifth mark and the sixth mark in the second direction.

6. The overlay operation method according to claim 5, wherein performing the operation further comprises judging whether the fourth offset is in a second range from a second pre-determined offset minus a second deviation to the second pre-determined offset plus the second deviation, and the second pre-determined offset is determined by the first photomask.

7. The overlay operation method according to claim 1, further comprising:
   identifying a seventh mark, an eighth mark and a ninth mark, wherein the ninth mark is formed on the seventh mark and the eighth pattern, the seventh mark and the eighth mark are formed by a third process in combination with using the first photomask before forming the first mark, and the ninth mark is formed by a fourth process in combination with using the second photomask before forming the third mark;
   performing a second measurement to obtain a seventh offset between the seventh mark and the eighth mark in the first direction before the first measurement; and
   comparing the first offset with the seventh offset when the first offset is not in the first range from the first pre-determined offset minus the first deviation to the first pre-determined offset plus the first deviation.

8. An overlay control method, comprising:
   providing a substrate;
   forming a first layer on the substrate by a first process in combination with using a first photomask, wherein the first layer comprises a first mark and a second mark;
   forming a second layer on the first layer by a second process different from the first process in combination with using a second photomask, wherein the second layer comprises a third mark;
   performing a first measurement to obtain a first offset between the first mark and the second mark in a first direction, a second offset between the first mark and the third mark in the first direction, and a third offset between the second mark and the third mark in the first direction; and
   performing an operation to judge whether the first offset is in a first range from a first pre-determined offset minus a first deviation to the first pre-determined offset plus the first deviation, wherein the first pre-determined offset is determined by the first photomask.

9. The overlay control method according to claim 8, further comprising deleting a first data of the second offset and a second data of the third offset when the first offset is not in the first range from the first pre-determined offset minus the first deviation to the first pre-determined offset plus the first deviation.

10. The overlay control method according to claim 8, further comprising storing a first data of the second offset and a second data of the third offset into an overlay parameter data base when the first offset is in the first range from the first pre-determined offset minus the first deviation to the first pre-determined offset plus the first deviation.

11. The overlay control method according to claim 8, wherein the first per-determined offset is larger than or equal to zero.

12. The overlay control method according to claim 8, wherein the first mark, the second mark and the third mark are arranged along the first direction, the first layer further comprises a fourth mark and a fifth mark, the second layer further comprises a sixth mark, and the fourth mark, the fifth mark and the sixth mark are arranged along a second direction perpendicular to the first direction, wherein performing the first measurement further comprises obtaining a fourth offset between the fourth mark and the fifth mark in the second direction, a fifth offset between the fourth mark and the sixth mark in the second direction, and a sixth offset between the fifth mark and the sixth mark in the second direction.

13. The overlay control method according to claim 12, wherein performing the operation further comprises judging whether the fourth offset is in a second range from a second pre-determined offset minus a second deviation to the second pre-determined offset plus the second deviation, and the second pre-determined offset is determined by the first photomask.

14. The overlay control method according to claim 8, further comprising:
   forming a third layer on the substrate by a third process in combination with using the first photomask before forming the first layer, wherein the third layer comprises a seventh mark and an eighth mark;
   forming a fourth layer on the third layer by a fourth process in combination with using the second photomask, wherein the fourth layer comprises a ninth mark;
   performing a second measurement to obtain a seventh offset between the seventh mark and the eighth mark in the first direction before the first measurement; and
   comparing the first offset with the seventh offset when the first offset is not in the first range from the first pre-determined offset minus the first deviation to the first pre-determined offset plus the first deviation.

15. The overlay control method according to claim 8, wherein the second photomask is aligned according to positions of the first mark and the second mark.

16. An overlay control method, comprising:
   providing a substrate;
   forming a first layer on the substrate by a first process in combination with using a photomask, wherein the first layer comprises a first mark and a second mark;
   forming a second layer on the first layer;
   performing a first measurement to obtain a first offset between the first mark and the second mark in a first direction; and
   performing an operation to judge whether the first offset is in a first range from a first pre-determined offset minus a first deviation to the first pre-determined offset plus the first deviation, wherein the first pre-determined offset is determined by the photomask.

17. The overlay control method according to claim 16, further comprising deleting a data of the first offset when the first offset is not in the first range from the first pre-determined offset minus the first deviation to the first pre-determined offset plus the first deviation.

18. The overlay control method according to claim 16, further comprising storing a data of the first offset into an overlay parameter data base when the first offset is in the first range from the first pre-determined offset minus the first deviation to the first pre-determined offset plus the first deviation.

19. The overlay control method according to claim 16, wherein the first per-determined offset is larger than or equal to zero.

20. The overlay control method according to claim 16, wherein the first mark and the second mark are arranged along the first direction, the first layer further comprises a third mark and a fourth mark, and the third mark and the fourth mark are arranged along a second direction perpendicular to the first direction, wherein performing the first measurement further comprises obtaining a second offset between the third mark and the fourth mark in the second direction.

21. The overlay control method according to claim 20, wherein performing the operation further comprises judging whether the second offset is in a second range from a second pre-determined offset minus a second deviation to the second pre-determined offset plus the second deviation, and the second pre-determined offset is determined by the photomask.

22. The overlay control method according to claim 16, further comprising:
   forming a third layer on the substrate by a second process in combination with using the photomask before forming the first layer, wherein the third layer comprises a fifth mark and a sixth mark;
   forming a fourth layer on the third layer;
   performing a second measurement to obtain a third offset between the fifth mark and the sixth mark in the first direction before performing the first measurement; and
   comparing the first offset with the third offset when the first offset is not in the first range from the first pre-determined offset minus the first deviation to the first pre-determined offset plus the first deviation.

* * * * *